United States Patent
Nayak et al.

(10) Patent No.: US 9,666,251 B2
(45) Date of Patent: May 30, 2017

(54) TRIM CONTROL WITH DEFAULT TRIM CODE CIRCUIT AND SECOND MULTIPLEXERS

(71) Applicant: Texas Instruments Incorporated, Dallas, TX (US)

(72) Inventors: Gopalkrishna Ullal Nayak, Glasgow (GB); Matthew Craig Bullock, West Lake Hills, TX (US)

(73) Assignee: Texas Instruments Incorporated, Dallas, TX (US)

( * ) Notice: Subject to any disclaimer, the term of this patent is extended or adjusted under 35 U.S.C. 154(b) by 7 days.

(21) Appl. No.: 14/744,655

(22) Filed: Jun. 19, 2015

(65) Prior Publication Data

US 2015/0287443 A1  Oct. 8, 2015

Related U.S. Application Data

(62) Division of application No. 13/765,208, filed on Feb. 12, 2013, now Pat. No. 9,093,336.

(51) Int. Cl.
| | |
|---|---|
| *H01L 21/66* | (2006.01) |
| *G11C 7/10* | (2006.01) |
| *G11C 29/04* | (2006.01) |

(52) U.S. Cl.
CPC .......... *G11C 7/1051* (2013.01); *G11C 7/1036* (2013.01); *G11C 29/04* (2013.01); *H01L 22/14* (2013.01); *H01L 22/20* (2013.01)

(58) Field of Classification Search
None
See application file for complete search history.

(56) References Cited

U.S. PATENT DOCUMENTS

2004/0207451 A1* 10/2004 Kitagawa ............... H03H 11/28
                                                              327/334

* cited by examiner

*Primary Examiner* — Michael Jung
*Assistant Examiner* — Jay C Chang
(74) *Attorney, Agent, or Firm* — Lawrence J. Bassuk; Charles A. Brill; Frank D. Cimino

(57) ABSTRACT

In a semiconductor chip for an electronic device, a programmable trim code is independent from a default trim code. An output trim code is produced by selecting either the default trim code or the programmable trim code. The default trim code for a plurality of the semiconductor chips is set by forming metal interconnects according to a first metal layout in a metal interconnect layer during fabrication of at least one of the semiconductor chips. The default trim code is reset by forming the metal interconnects according to a second metal layout in the metal interconnect layer during fabrication of subsequent semiconductor chips.

5 Claims, 4 Drawing Sheets

TRIM CONTROL WITH DEFAULT TRIM CODE CIRCUIT AND SECOND MULTIPLEXERS

This Application is a divisional of prior application Ser. No. 13/765,208, filed Feb. 12, 2013, now U.S. Pat. No. 9,093,336, issued Jul. 28, 2015.

BACKGROUND OF THE INVENTION

An electronic circuit in a semiconductor chip or die commonly undergoes many modifications during its various design, characterization, testing and/or manufacturing phases. Some modifications are significant changes to the circuit design, but others may involve simple tweaking or trimming of various characteristics within the circuit. Such characteristics are typically, but not necessarily, analog parameters, such as a voltage level at a particular node, a period of a timer, a frequency of a signal or any other measurable parameter of any part of the circuit. The trimming generally adds to or subtracts from the value of any of the measured parameters in order to ensure that the electronic circuit, or a portion thereof, operates according to its required or stated specifications.

In many cases, the values of the measured parameters are highly dependent on the manufacturing processes used to fabricate the semiconductor chip. No semiconductor manufacturing process is 100% guaranteed to generate structures exactly the same in every semiconductor chip. Some variation is expected, and some level of tolerance is generally allowed. In general, a resistance, capacitance, inductance, voltage, current or other property at one or more locations within the semiconductor chip is trimmed in order to ensure that the measured parameters are within an allowable tolerance.

The trimming is commonly done with a series of bits, known as a trim code, that connect to a desired location or node within the electronic circuit to alter the physical characteristics of the circuit at that location. One or more such trim codes are typically taken into consideration during almost all phases of a product, from the initial design phase to production of marketable products. The necessary circuit components for applying the trim codes to the desired locations within the circuit are usually included in the initial design.

The values for the trim codes (e.g. a high or low voltage on each trim bit) are initially determined during design and characterization of the electronic circuit using computer model simulations. The determined trim code is then hardwired into the design as a "default trim code" that should enable the semiconductor chip to be at least nominally operational when it comes off the fabrication line, so that the test, characterization or production engineers (or other people who initially receive the completed semiconductor chips) at least have a functional starting point from which they can determine a better trim code. Further testing of the semiconductor chip (whether in a wafer form, a singulated die or a fully packaged IC) generally enables fine tuning of the trim code and leads to the determination of a final trim code that may be used to override the default trim code to result in a fully and properly functioning electronic circuit. Additionally, sometimes the testing of the semiconductor chip enables the design of the electronic circuit to be changed to update the default trim code by changing the circuit components for applying the trim codes, so that it isn't always necessary to override the default trim code for every produced semiconductor chip.

An example of a prior art trim control circuit 100 for use in a semiconductor chip is shown in FIG. 1. The prior art trim control circuit 100 illustrates a prior art technique of forming the default trim code and eventually overriding the default trim code with a final trim code, if necessary. The trim control circuit 100 generally includes a shift register 101, a "test trim data register" 102, a set of multiplexors 103 and a set of inverters and buffers 104. Upon power-up of the semiconductor chip, registers 105 within the shift register 101 are loaded with a programmable trim code through an "IN" node 106 from any suitable programmable memory component, such as an eFUSE. Under control of a programmable "test trim enable" bit 107 (from the test trim data register 102), the set of multiplexors 103 selects either the programmable trim code from the shift register 101 or a programmable "test trim code" 108 from the test trim data register 102 to be passed through to the set of inverters and buffers 104. The output of the set of inverters and buffers 104 is an "output trim code" that is provided to a desired location or node within the electronic circuit of the semiconductor chip.

When the semiconductor chip is initially powered on, e.g. during testing or regular operation, the registers 105 are cleared and the test trim enable bit 107 is set to "disable." In this situation, the set of multiplexors 103 output all zero bits, some of which are inverted, depending on whether they pass through an inverter 109 or a buffer 110 (in the set of inverters and buffers 104), before being produced as the output trim code. The set of inverters and buffers 104, therefore, generally forms the default trim code when the inputs provided thereto are all zero bits.

After the semiconductor chip is fabricated, it is typically tested to determine whether it operates within its specifications. If it passes this test, then the default trim code is evidently appropriate. If it fails, however, then the semiconductor chip may still be made to operate within its specifications by overriding the default trim code with a different trim code. To determine a proper trim code, a trim code search may be performed using the test trim data register 102.

To perform a trim code search, the test trim data register 102 is loaded through an I/O port (e.g. test pads on a wafer or unpackaged die, I/O pins on a packaged die, etc.) with test values for the test trim code 108, and the test trim enable bit 107 is enabled. The set of multiplexors 103, thus, produces the test trim code 108, some of the bits of which are inverted by the set of inverters and buffers 104.

Since the set of inverters and buffers 104 may invert some of the bits of the test trim code 108, it is typically necessary for the person performing the trim code search to know which of the bits are inverted. With this knowledge, the high or low values for the bits for the test trim code 108 can be chosen appropriately, so the trim code search can proceed in an orderly fashion to narrow in on a proper trim code. Failure to properly account for the locations of the inverters 109 can cause the trim code search to be confusing and potentially produce faulty results. If done properly, however, the trim code discovered by the search can then be loaded into the programmable memory component (e.g. by blowing an eFUSE) that supplies the programmable trim code through the IN node 106 to the shift register 101. In this manner, the default trim code is overridden by a better trim code.

In some designs, the set of inverters and buffers 104 that form the default trim code may be placed between the shifter register 101 and the set of multiplexors 103. In this case, the trim code search does not need to take into consideration the location of the inverters 109, since the test trim code 108 passes unchanged from the set of multiplexors 103 to the output trim code. However, when the trim code discovered by the trim code search is loaded into the programmable memory component (e.g. by blowing an eFUSE) that supplies the programmable trim code through the IN node 106 to the shift register 101, then the discovered trim code needs to be converted in accordance with the locations of the inverters 109, which can potentially cause confusion and a faulty override trim code if not done properly.

The trim code search can potentially represent a significant amount of time within the overall manufacturing process if the search has to be done for every semiconductor chip produced. However, a better default trim code (one that is less likely to have to be overridden) may be discovered after several trim code searches have been conducted on test or production samples of the semiconductor chips. Therefore, the time for trim code searches on subsequently produced semiconductor chips can potentially be reduced or eliminated if the design of the electronic circuit can be changed to update the default trim code to the better default trim code.

To make such changes to the default trim code, some of the inverters 109 can be changed to buffers 110 and some of the buffers 110 can be changed to inverters 109. Within the semiconductor chip, however, the semiconductor structures for the inverters 109 and the buffers 110 are typically below several other layers of materials, particularly the metal interconnect layers that electrically connect the various semiconductor devices in the chip. Changes made at that depth within the semiconductor chip layers can potentially adversely affect other semiconductor devices or other layers of materials. Time consuming additional tests or design changes may have to be done to ensure that the semiconductor chip still performs properly after making changes to the inverters 109 and the buffers 110. A change to the default trim code, therefore, is generally not to be undertaken lightly.

It is with respect to these and other background considerations that the present invention has evolved.

SUMMARY OF THE INVENTION

According to some embodiments, the present invention involves setting default trim bits for a plurality of semiconductor chips by forming metal interconnects according to a first metal layout in a metal interconnect layer during fabrication of at least one of the semiconductor chips. Resetting the default trim bits can be done by forming the metal interconnects according to a second metal layout in the metal interconnect layer during fabrication of a subsequent one of the semiconductor chips.

In some embodiments, the present invention involves an electronic device that includes both default trim code/bits and programmable trim code/bits in a semiconductor chip, with the programmable trim code/bits being independent from the default trim code/bits. A selection is made between the default trim code/bits and the programmable trim code/bits to produce an output trim code/bits.

A more complete appreciation of the present disclosure and its scope, and the manner in which it achieves the above noted improvements, can be obtained by reference to the following detailed description of presently preferred embodiments taken in connection with the accompanying drawings, which are briefly summarized below, and the appended claims.

DETAILED DESCRIPTION OF THE INVENTION

Figure 2:
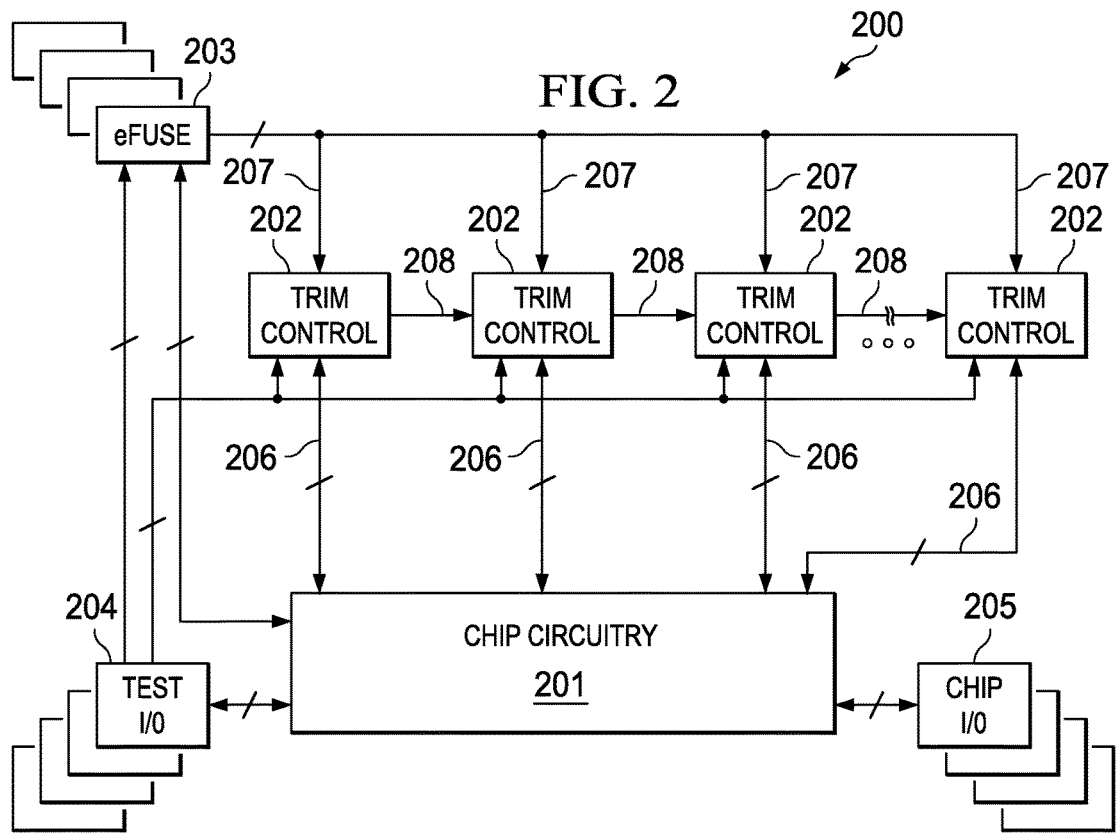
FIG. 2 is a simplified schematic diagram of an example electronic circuit incorporating an embodiment of the present invention.

A simplified schematic diagram of an example electronic circuit 200 that may be formed in a semiconductor chip and incorporated into a packaged IC for use in an electronic device incorporating an embodiment of the present invention is shown in FIG. 2. In general, the electronic circuit 200 includes "chip circuitry" 201, one or more "trim control" circuits 202, one or more "eFUSE" components (or other appropriate data storage devices) 203, test I/O pads 204 and chip I/O nodes 205, among other components not shown for simplicity. The chip circuitry 201 generally represents a variety of any appropriate electronic components that perform the primary functions of the electronic circuit 200 and that communicate with other components of the overall electronic device through the chip I/O nodes 205. The eFUSE 203 may be considered part of the trim control circuits 202 in some embodiments.

The trim control circuits 202 generally connect (e.g. through lines 206) to various appropriate locations or nodes within the chip circuitry 201 to trim any desired circuit characteristics, e.g. design features that are sensitive to slight variations in the processes used to fabricate the semiconductor chip. Upon power-up of the electronic circuit 200, the eFUSE 203 generally provides the trim codes (programmable trim codes) to the trim control circuits 202 once the eFUSE 203 has been loaded/blown with the codes along with at least one programmable control bit (valid signal or enable bit). If there is more than one trim control circuit 202 and more than one eFUSE 203, then the eFUSEs 202 may connect to each trim control circuit 202 individually, e.g. through lines 207. Alternatively, the eFUSE 203 may connect directly to a first one of the trim control circuits 202 and the programmable trim code bits may be serially shifted through the first trim control circuit 202 (e.g. through one of the lines 207) and then through each of the other trim control circuits 202 (e.g. through lines 208) in turn until all of the trim control circuits 202 are loaded.

Prior to loading the eFUSE 203 with the programmable trim code bits and the programmable control bit, the trim control circuits 202 provide a default trim code to the chip circuitry 201 (except during trim code searches when the default trim code is temporarily overridden). The default trim code is hardwired into the electronic circuit 200 within upper metal interconnect layers of the semiconductor chip, as described below with reference to FIG. 5. In this manner, some bits of the default trim code are connected through the upper metal interconnect layers to a high voltage source, while other bits are connected through the upper metal interconnect layers to ground or a low voltage source. The default trim code bits are initially determined by simulating the electronic circuit 200 and are initially set within Verilog, VHDL or other hardware descriptive language (HDL) code during the design and/or characterization phases of product development. (The initial default trim code bit values should enable the electronic circuit 200 to be nominally operational when the semiconductor chip comes off the fabrication line.) Then during fabrication, the default trim code bits are set within the semiconductor chips by forming the metal interconnect layers according to a metal layout determined from the HDL code and signal routing requirements. Resetting the default trim code bits for subsequently fabricated semiconductor chips can be done simply by changing the metal interconnects according to a different metal layout in the upper metal interconnect layers, e.g. as part of an engineering change order (ECO) that changes one or more of the metal interconnect layers. Lower layers of the semiconductor chip, such as the semiconductor layers where active devices are formed, are not affected by these changes.

Figure 1:
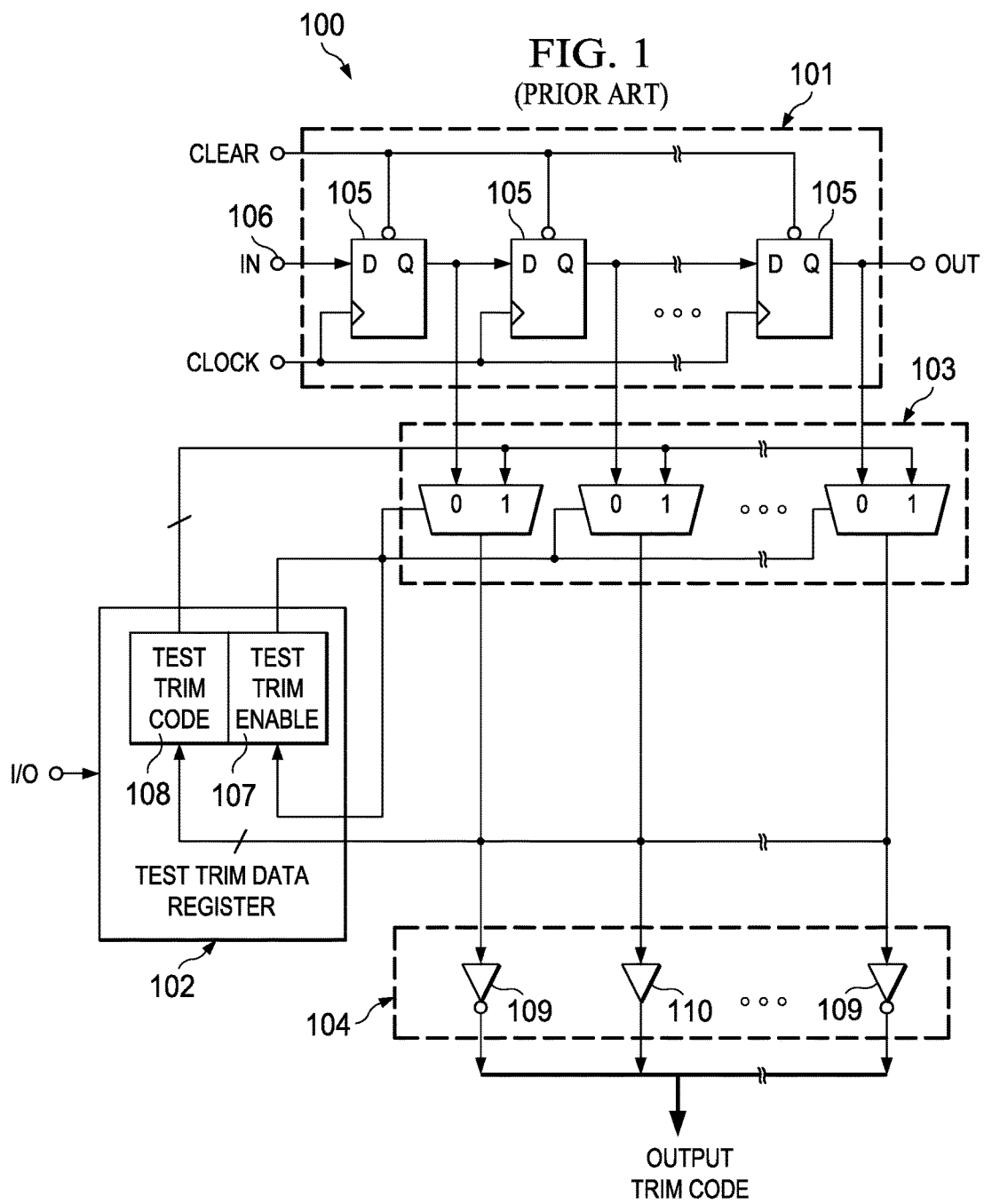
FIG. 1 is a simplified schematic diagram of an example prior art trim control circuit.

Thus, making changes to the default trim codes at any stage of product development or production is a relatively simple issue compared to the prior art example described above. In the prior art example of FIG. 1, making changes to the default trim codes involved changing the inverters 109 and buffers 110, which required changes within the semiconductor layers of the semiconductor chip and could affect other semiconductor components and/or other layers of the semiconductor chip. Such changes within the semiconductor layers could, therefore, require further testing and possibly additional changes to ensure that the electronic circuit performed according to specifications. Embodiments of the present invention eliminate or reduce such issues.

The test I/O pads 204 generally enable test or production engineers to access various locations within the semiconductor chip, e.g. using test machines with probes when the semiconductor chip is in wafer form or unpackaged singulated die form (i.e. generally before IC packaging). In some embodiments, even after packaging the semiconductor chip, one or more of the chip I/O nodes 205 may continue to enable the test or production engineers to access some locations within the semiconductor chip, e.g. using a serial bus, such as I²C, or other appropriate I/O subsystem.

Depending on the embodiment, therefore, the test I/O pads 204 and/or the chip I/O nodes 205 provide access to various desired nodes within the chip circuitry 201 as well as to the eFUSE 203 and the trim control circuits 202. In this manner, various desired parameters can be accessed and measured at predetermined locations within the electronic circuit 200. Using the test I/O pads 204 and/or the chip I/O nodes 205, the electronic circuit 200 can be tested to determine whether it operates within specifications. If the electronic circuit 200 does not perform according to specifications, then a trim code search can be performed also using the test I/O pads 204 and/or the chip I/O nodes 205 to load a series of test trim codes into the trim control circuits 202.

When a better trim code than the default trim code is discovered, then the new trim code (programmable trim code) can be loaded into the eFUSE 203, along with at least one programmable control bit, again using the test I/O pads 204 and/or the chip I/O nodes 205. The programmable control bit, when set, causes circuitry within the trim control circuits 202 to select the programmable trim code, instead of the default trim code (except during trim code searches), thereby permanently overriding the default trim code (or portions thereof) for subsequent operation of the electronic circuit 200, as described below. During trim code searches, on the other hand, a separate test trim enable bit causes the circuitry within the trim control circuits 202 to select a test trim code (input through the test I/O pads 204 and/or the chip I/O nodes 205), instead of the programmable trim code or the default trim code, thereby temporarily overriding both the programmable trim code and the default trim code.

The programmable control bit, along with the test trim enable bit, enables the programmable trim code and the default trim code to be separate and independent from each other and from the test trim code. Therefore, unlike in the prior art example described above, neither the programmable trim code nor the test trim code is dependent on the value of the default trim code. In the prior art example of FIG. 1, since the programmable trim code from the shift register 101 and the test trim code 108 from the test trim data register 102 pass through the set of inverters and buffers 104, the person who either loads the programmable trim code (into the programmable memory component that supplies the programmable trim code through the IN node 106) or runs the trim code search (through the test trim data register 102) must take into consideration the placement of the inverters 109 and buffers 110. This requirement can potentially cause confusion and result in a faulty programmable trim code if not handled properly. Embodiments of the present invention, however, generally eliminate such issues, since the programmable trim code, the test trim code and the default trim code are separate and independent from each other.

Figure 3:
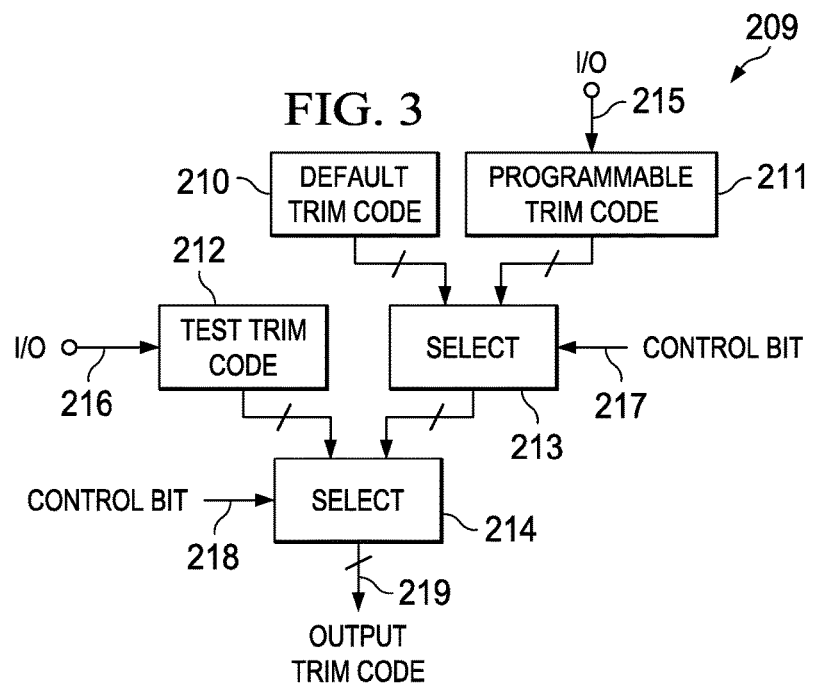
FIG. 3 is a simplified functional diagram of an example trim control circuit for use in the electronic circuit shown in FIG. 2 in accordance with an embodiment of the present invention.

FIG. 3 illustrates general functions for a simplified example of a trim control circuit 209 that may be used for the trim control circuits 202 in FIG. 2 in accordance with an embodiment of the present invention in which the programmable trim code, the test trim code and the default trim code are separate and independent from each other. The trim control circuit 209 generally includes a component for producing the default trim code 210, a component for storing the programmable trim code 211, a component for storing the test trim code 212 and two 2-to-1 selection components 213 and 214. The actual hardware represented by these components may be any appropriate devices and structures with attendant connections for performing the functions described herein. The component for producing the default trim code 210, however, generally includes the metal interconnects (in the upper metal interconnect layers) to any appropriate high and low voltage sources, as mentioned above and described further below.

Inputs to the trim control circuit 209 generally include "I/O" connections 215 and 216 to the component for storing the programmable trim code 211 and the component for storing the test trim code 212, respectively. The I/O connections 215 and 216 generally lead to the test I/O pads 204 and/or the chip I/O nodes 205.

In this simplified example, the default trim code (from 210) and the programmable trim code (from 211) are provided to the first selection component 213. A control bit 217 (e.g. the aforementioned programmable control bit) causes the first selection component 213 to select either the default trim code (from 210) or the programmable trim code (from 211) to be passed to the second selection component 214. The test trim code (from 212) is also provided to the second selection component 214. A second control bit 218 (e.g. the aforementioned test trim enable bit) causes the second selection component 214 to select either the output from the first selection component 213 or the test trim code (from 212) to be produced as an output trim code 219. The output trim code 219 is provided (e.g. through lines 206, FIG. 2) to an appropriate location or node within the chip circuitry 201 to trim a desired circuit characteristic.

It is understood that the present invention is not necessarily limited to the configuration of components shown in FIG. 3. For example, a 3-to-1 selection component could be used in place of the two 2-to-1 selection components 213 and 214, and the control bits 217 and 218 could be used as a 2-bit control signal to select which of the programmable trim code, the test trim code and the default trim code is produced as the output trim code 219. Other configurations and components may also be used.

Figure 4:
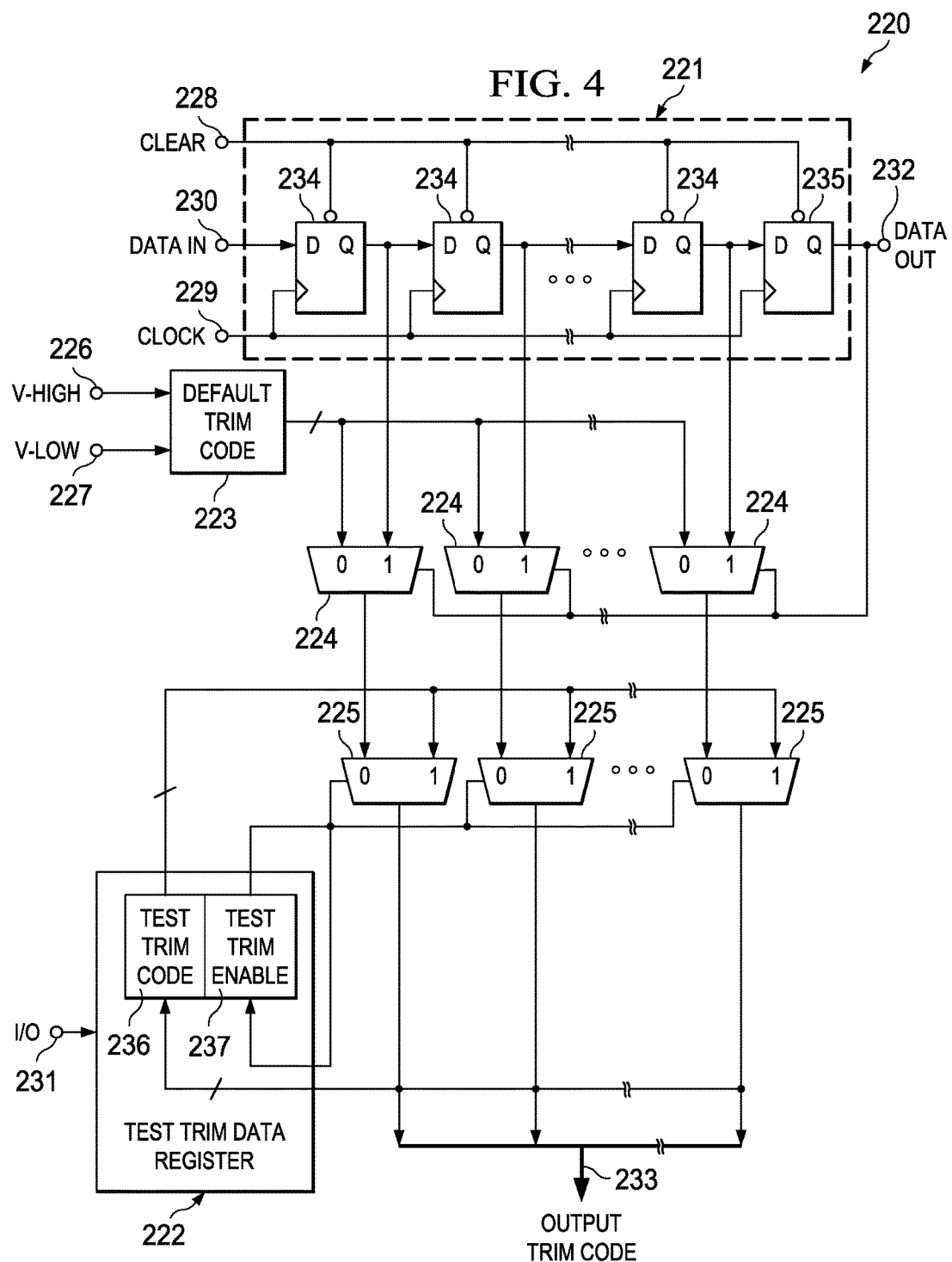
FIG. 4 is a simplified schematic diagram of the example trim control circuit shown in FIG. 3 in accordance with an embodiment of the present invention.

FIG. 4 illustrates a more detailed, but still simplified, schematic diagram of an example trim control circuit 220 that may be used for the trim control circuits 202 in FIG. 2 in accordance with an embodiment of the present invention. The example trim control circuit 220 generally includes a shift register 221, a "test trim data register" 222, a "default trim code" circuit or cell 223 and two sets of multiplexors 224 and 225. Again, it is understood that the present invention is not necessarily limited to the configuration of components shown in FIG. 4. Other configurations and components may also be used.

Inputs to the trim control circuit 220 generally include a high voltage ("V-high") 226, a low voltage ("V-low") 227, a "clear" signal 228, a "clock" signal 229, a "data IN" signal 230 and an "I/O" signal 231. Outputs from the trim control circuit 220 generally include a "data OUT" signal 232 and an "output trim code" 233. Other inputs and outputs may also be included, but are not shown for simplicity.

The default trim code circuit 223 generally includes the metal interconnects (in the upper metal interconnect layers) connected to the high voltage source 226 and the low voltage source 227 as appropriate, as mentioned above and described further below. The bits of the default trim code (from 223) are provided to a first input of each of the first multiplexors 224.

The shift register 221 generally includes multiple registers or D-flip-flops 234 and an additional register or D-flip-flop 235 connected in series. The clear signal 228 clears each of the registers 234 and 235, typically at power-up of the overall electronic circuit 200. The data IN signal 230 generally connects to the eFUSE (or other appropriate data storage device) 203. Therefore, if the eFUSE 203 has been loaded with the programmable control bit and the programmable trim code, the data IN signal 230 supplies (with each cycle of the clock signal 229) the programmable control bit and the programmable trim code bits serially through the first of the registers 234 to each of the other registers 234 and 235 until the registers 234 and 235 are loaded. The registers 234 then contain the programmable trim code bits, and the additional register 235 contains the programmable control bit. (The additional register 235, although it is shown as the last register in the shift register 221, could be placed anywhere in the series.)

In some embodiments, before the programmable trim code is loaded into the eFUSE 203, the eFUSE 203 may provide all zero bits to the shift register 221 for the programmable trim code and the programmable control bit. After the programmable trim code is loaded into the eFUSE 203, the eFUSE 203 provides the desired programmable trim code and a logic value of 1 for the programmable control bit to the shift register 221.

Additionally, the data OUT signal 232 allows the shift register 221 to serially transmit the bits as another data IN signal to another similar shift register of another similar trim control circuit. Several similar trim control circuits could thus be loaded serially from the same eFUSE 203. The data OUT signal of the last such trim control circuit in the series could be used to indicate that each of the trim control circuits has been properly loaded with their programmable trim code bits and programmable control bits. Alternatively, the last such trim control circuit in the series may not have the data OUT signal.

The programmable trim code bits (from the outputs of the registers 234) are provided to a second input of each of the first multiplexors 224. The programmable control bit (from the output of the register 235) is provided to a control input of each of the first multiplexors 224. When set, the programmable control bit causes the first multiplexors 224 to output the programmable trim code bits. When not set, the programmable control bit causes the first multiplexors 224 to output the default trim code bits. In other words, setting the programmable control bit causes the trim control circuit 220 to override the default trim code with the programmable trim code.

Therefore, before the eFUSE 203 (FIG. 2) is loaded with the programmable trim code, the programmable control bit has a "not set" value (e.g. a logic 0). In this manner, the default trim code is passed through the first multiplexors 224. After the eFUSE 203 is loaded with the programmable trim code, the programmable control bit is given a "set" value (e.g. a logic 1). In this case, the programmable trim code is passed through the first multiplexors 224.

The test trim data register 222 (sometimes called a soft trim code core data register) generally includes memory space for "test trim code" bits 236 and a "test trim enable" bit 237. Additionally, the test trim data register 222 is connected to receive the I/O signal 231. During a trim code search, test trim code bits 236 are supplied through the I/O signal 231 to the test trim data register 222, and the test trim enable bit 237 is set.

The second multiplexors 225 receive the outputs of the first multiplexors 224 at first inputs and the test trim code bits 236 at second inputs. The test trim enable bit 237 is supplied to control inputs of the second multiplexors 225. The output of the second multiplexors 225 is the output trim code 233, which is provided (e.g. through lines 206, FIG. 2) to an appropriate location or node within the chip circuitry 201 to trim a desired circuit characteristic. Therefore, during a trim code search when the test trim enable bit 237 is set (e.g. with a logic 1 value), the second multiplexors 225 produce the test trim code bits 236 as the output trim code 233. At other times, the test trim enable bit 237 is not set (e.g. with a logic 0 value), so the second multiplexors 225 pass the outputs of the first multiplexors 224 as the output trim code 233. After the trim code search has been done and the programmable trim code has been loaded in the eFUSE 203, the test trim enable bit 237 may be permanently set to a logic 0 value, so that the electronic circuit 200 (FIG. 2) can thereafter operate properly.

Figure 5:
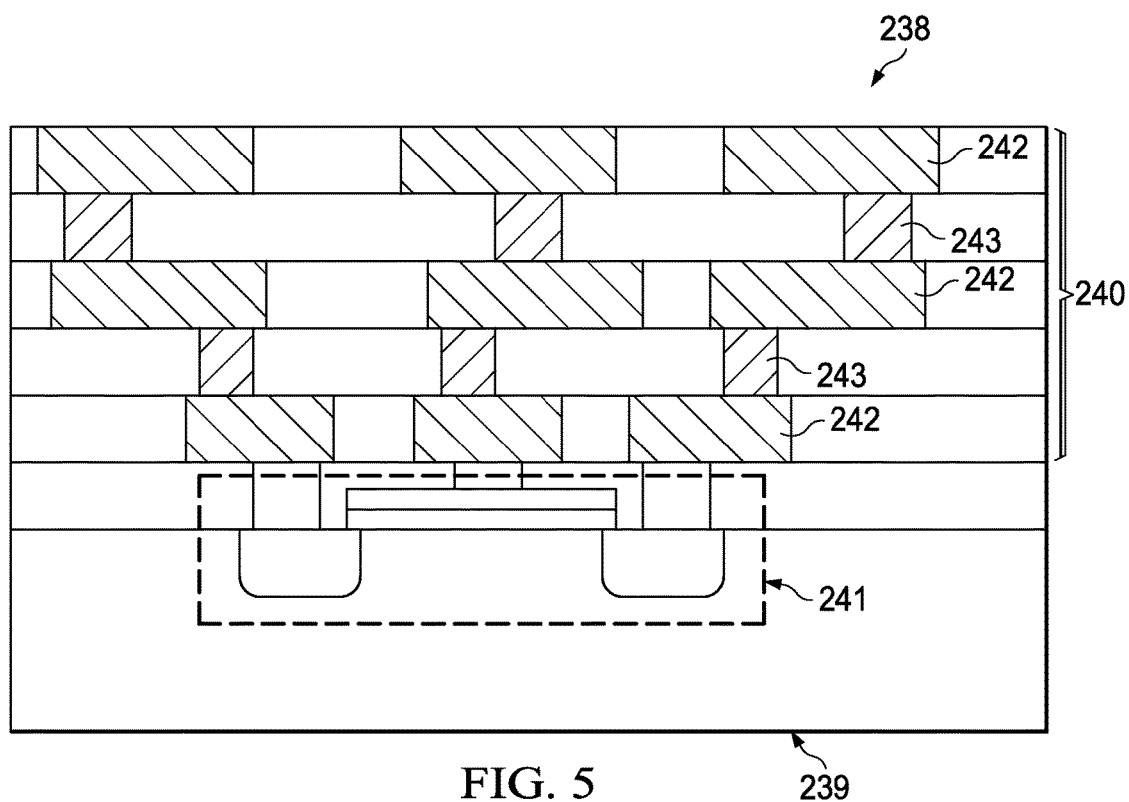
FIG. 5 is a simplified cross section diagram of an example portion of a semiconductor chip in which the electronic circuit shown in FIG. 2 may be formed in accordance with an embodiment of the present invention.

FIG. 5 illustrates a simplified example portion of a semiconductor chip 238 in which the electronic circuit 200 may be formed in accordance with an embodiment of the present invention. The semiconductor chip 238 generally includes a semiconductor substrate 239 overlaid by multiple metal (or other electrically conductive material) interconnect layers 240. Structures for various semiconductor devices (e.g. a CMOS transistor 241) are formed in and on the semiconductor substrate 239. Metal traces 242 and vias 243 are formed within the metal interconnect layers 240 in order to connect the various semiconductor devices to each other and to other types of components.

The metal traces 242 that connect between the voltage sources 226 and 227 and the first multiplexors 224 to form the default trim code bits (from 223, FIG. 4) are in the upper metal interconnect layers 240. (The relevant metal traces 242 do not necessarily have to be in the top-most metal interconnect layer 240, but in some embodiments it may be preferable to place them there.) Simple changes made to the upper metal interconnect layers 240 are not likely to have much of an effect on the underlying semiconductor devices. Therefore, it is possible to change the default trim code with little or no adverse effects on the rest of the electronic circuit 200.

Presently preferred embodiments of the present invention and its improvements have been described with a degree of particularity. This description has been made by way of preferred example. It should be understood, however, that the scope of the claimed subject matter is defined by the following claims, and should not be unnecessarily limited by the detailed description of the preferred embodiments set forth above.

The invention claimed is:

1. A trim control circuit comprising:
   (a) a programmable trim code shift register having a serial data input, a serial data output, and parallel programmable trim code outputs;
   (b) a test trim data register having parallel test trim code outputs, parallel test trim code inputs, and a test trim enable output;
   (c) first multiplexer circuits, each first multiplexer circuit having a first input connected to a parallel test trim code output, a second input, a control input connected to the test trim enable output, and a trim code output coupled to a parallel test trim code input;
   (d) a default trim code circuit having parallel default trim code outputs; and
   (e) second multiplexer circuits, each second multiplexer circuit having a first input connected to a parallel programmable trim code output, a second input connected to a parallel default trim code output, a control input connected to an output of the programmable trim code shift register, and an output connected to a second input of the first multiplexer circuits.

2. The circuit of claim 1 in which the shift register includes individual registers with outputs connected to the parallel programmable trim code outputs, and an additional register having an output connected to the control inputs of the second multiplexer circuits.

3. The circuit of claim 1 in which the default trim code circuit includes metal interconnects to a high voltage source and a low voltage source.

4. The circuit of claim 1 in which the test trim data register includes a data input/output.

5. The circuit of claim 1 in which the shift register includes a clear input and a clock input.

* * * * *